US005488339A

United States Patent [19]
Havens et al.

[11] Patent Number: 5,488,339
[45] Date of Patent: Jan. 30, 1996

[54] PASSIVE SHIELDING OF MOBILE MAGNETIC RESONANCE IMAGING MAGNET

[75] Inventors: Timothy J. Havens; Yulan Tan; John Scaturro, Jr., all of Florence, S.C.

[73] Assignee: General Electric Company, Milwaukee, Wis.

[21] Appl. No.: 156,605

[22] Filed: Nov. 23, 1993

[51] Int. Cl.⁶ .................................................... H01F 1/00
[52] U.S. Cl. .................... 335/216; 335/301; 324/318; 324/319; 307/91
[58] Field of Search ................. 307/89–91, 104; 361/143, 146; 174/35 R; 324/318–320; 128/653.5; 335/301, 216, 324, 219, 296–299

[56] References Cited

U.S. PATENT DOCUMENTS

| | | | |
|---|---|---|---|
| 4,803,433 | 2/1989 | McBride | 335/298 |
| 5,002,068 | 3/1991 | Provell | 128/846 |
| 5,012,217 | 4/1991 | Pakovich et al. | 335/301 |
| 5,138,383 | 8/1992 | Shiga et al. | 335/216 |
| 5,389,909 | 2/1995 | Havens | 335/216 |

Primary Examiner—William M. Shoop, Jr.
Assistant Examiner—Peter Ganjoo
Attorney, Agent, or Firm—Irving M. Freedman; John H. Pilarski

[57] ABSTRACT

A lightweight passive magnetic shielding system for a mobile magnetic resonance imaging (MRI) superconducting magnet is provided to enable transportation of the MRI while at superconducting operation within the regulations limiting the strength of the stray magnetic field of the MRI magnet and the weight of the vehicle including the MRI system.

18 Claims, 2 Drawing Sheets

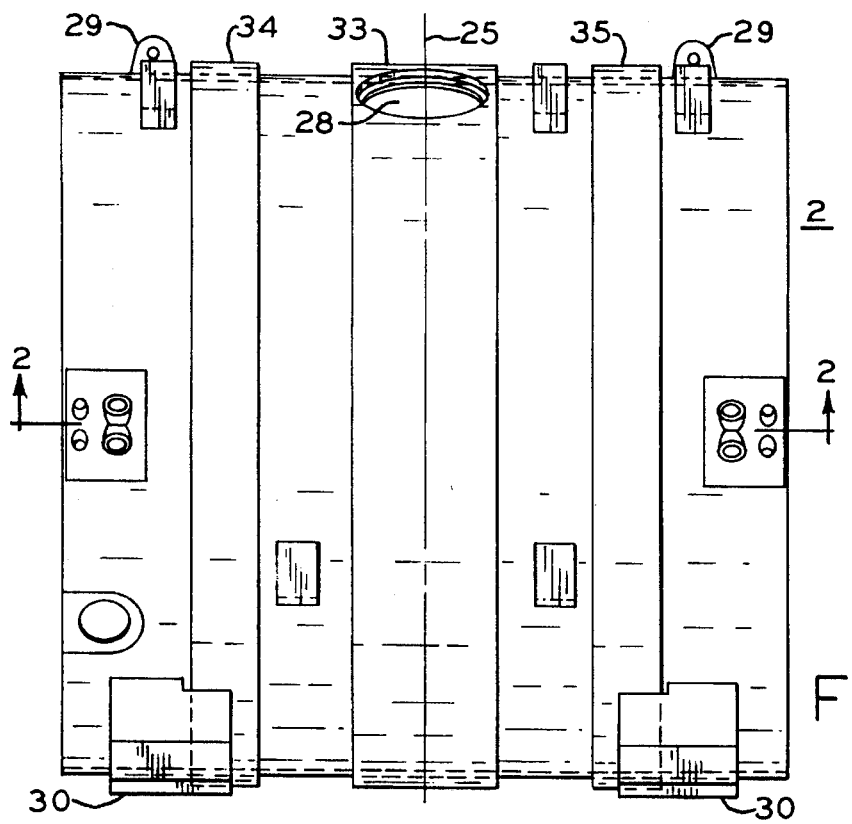
FIG_1
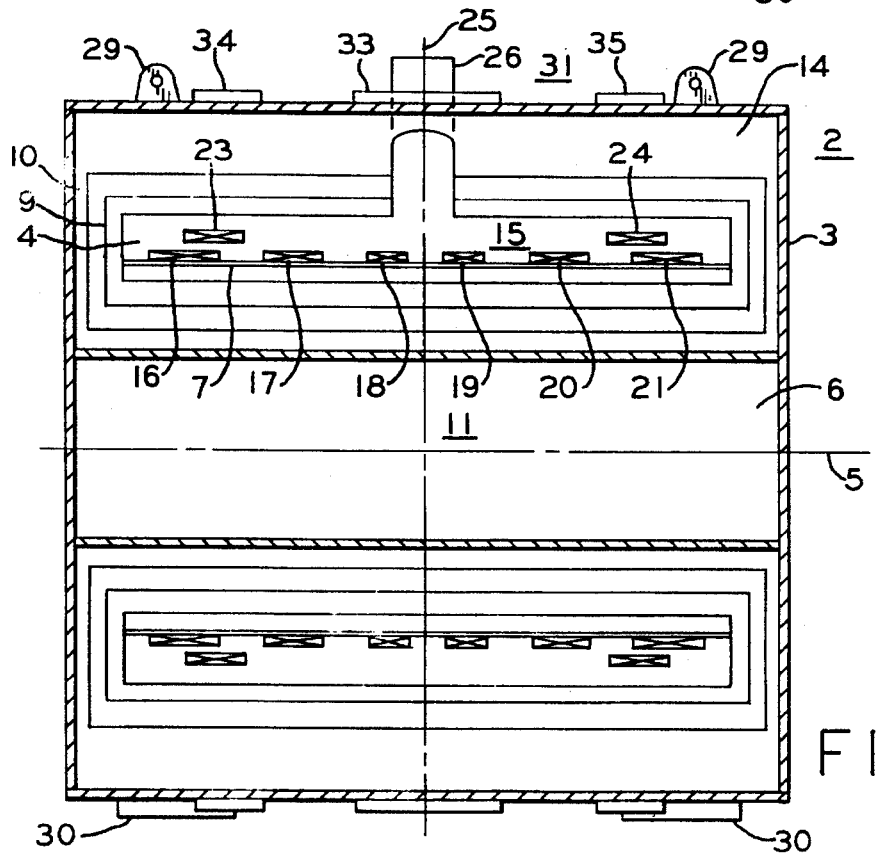
FIG_2

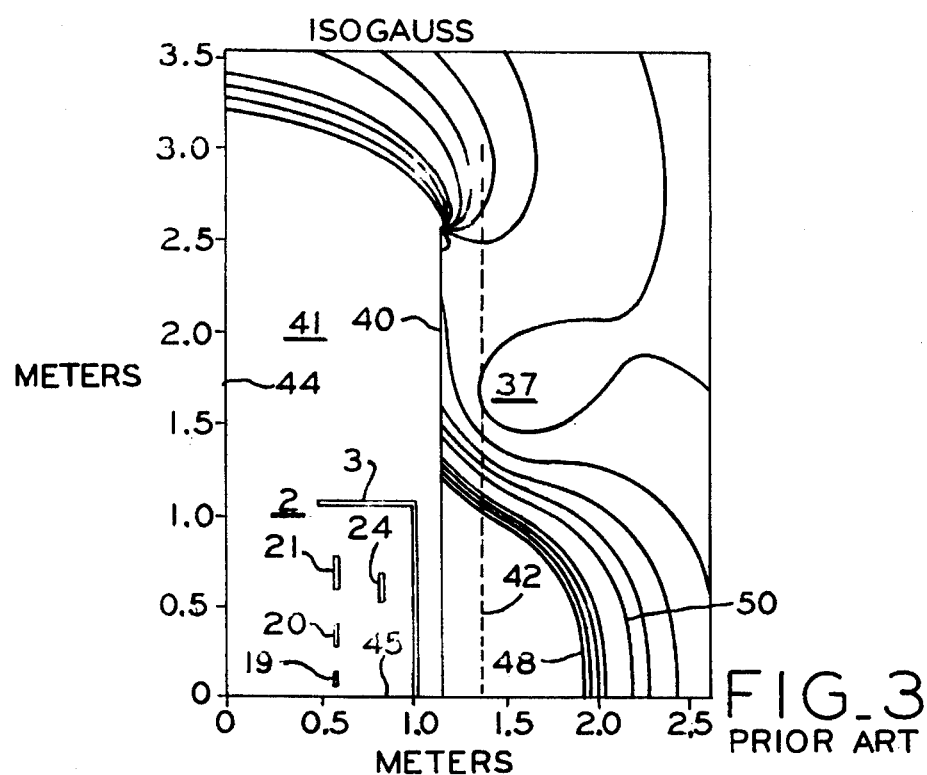
FIG_3 PRIOR ART
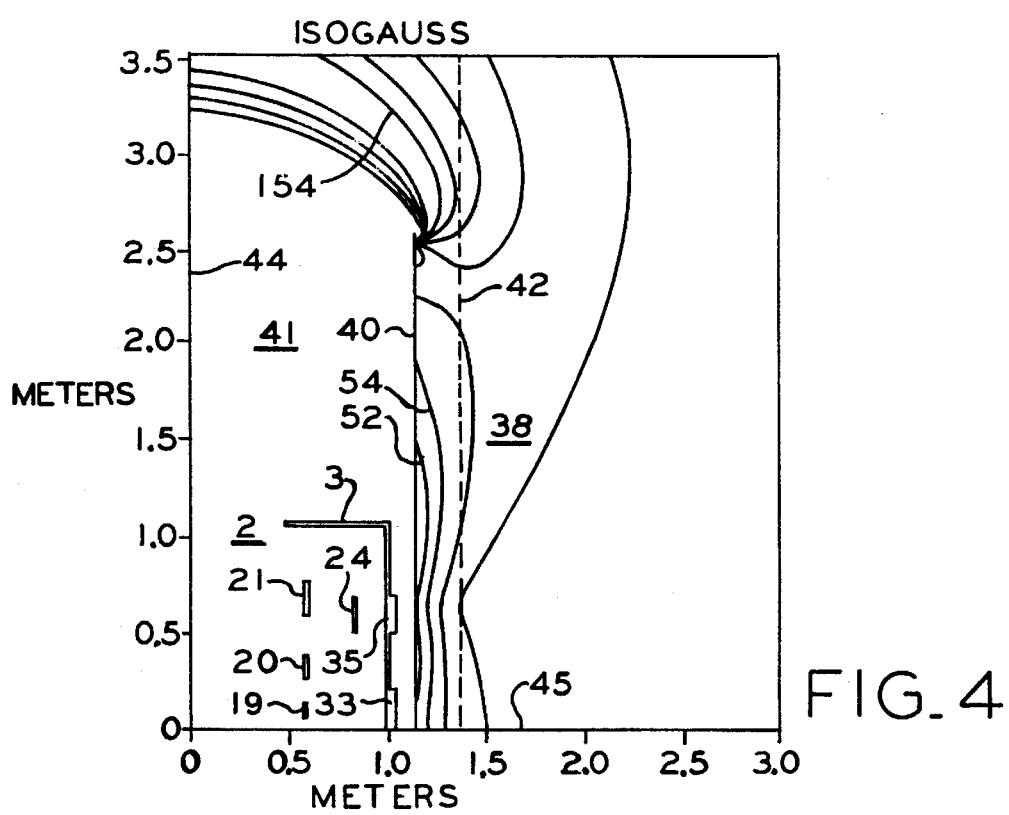
FIG_4

PASSIVE SHIELDING OF MOBILE MAGNETIC RESONANCE IMAGING MAGNET

BACKGROUND OF INVENTION

As is well known, a magnet coil can be made superconducting by placing it in an extremely cold environment, such as by enclosing it in a cryostat or pressure vessel containing liquid helium or other cryogen. The extreme cold reduces the resistance of the magnet coil to negligible levels, such that when a power source is initially connected to the coil for a period of time to introduce a current flow through the coil, the current will continue to flow through the coil due to the negligible coil resistance even after power is removed, thereby maintaining a strong magnetic field. Superconducting magnets find wide application, for example, in the field of magnetic resonance imaging (hereinafter "MRI").

MRI equipment is relatively expensive such that a single installation is frequently shared by a plurality of medical facilities or medical practitioners. While there are regional fixed MRI locations, there are also a plurality of mobile MRI installations installed in tractor trailers which are periodically moved to a plurality of geographically spaced locations to serve such a plurality of locations, typically smaller communities that cannot afford to maintain an MRI installation.

There are a number of problems encountered by a mobile MRI. A mobile MRI is frequently operated in a parking lot adjacent to a hospital or medical facility and is a self-contained imaging room including the MRI equipment, space for the operator along with related controls and accessories plus space for the ingress and egress of patients. However, because of the extremely strong magnetic fields generated by MRI equipment, there are applicable regulations limiting the area covered by the strong magnetic field, requiring the spatial confinement or restriction of the stray magnetic field in the region surrounding the MRI equipment. In a hospital imaging room this stray magnetic field confinement is frequently accomplished by large and extremely heavy shields of ferromagnetic material placed, for example, in the walls and ceiling of the imaging room and/or around the MRI magnet. However, problems in maintaining the necessary field homogeniety in the MRI imaging bore must be considered and resolved in any shielding of an MRI superconducting magnet.

Mobile MRI installations must also meet additional applicable federal and local regulations such as Department of Transportation regulations limiting the weight of vehicles on roads and bridges. Other reasons, including those of economy, have resulted in the inability to effectively shield a high field mobile MRI superconducting magnet installation in the order of field strength 1.0T (Tesla) or greater sufficiently to transport the MRI equipment "at field" or in the superconducting state.

The regulations regarding the magnet's field confinement require that the magnetic field strength not exceed five gauss 6 inches beyond the walls of an installation if the general public is not restricted from the area. One reason for such a regulation is that of inadvertent exposure to a strong magnetic field by a person wearing an electronic heart pacer regulating the heart action of the wearer can cause misfunction or failure of the pacer, and possible death of the person. Also, strong magnetic fields can adversely affect the operation of other electronic equipment in the vicinity including that within adjacent vehicles such as police or other emergency vehicles.

As a result, it is common practice to erect a temporary barricade a safe distance around a parked and operating the high field mobile MRI superconducting magnet unit to prevent persons or equipment coming within the region where the magnetic field is in excess of five gauss. However, when moving such mobile MRI unit from one location to another, superconducting magnet operation must be discontinued because of the inability to control the passage or presence of vehicles and persons on the highways and elsewhere, such as at rest stops, coming within the strong magnetic fields which extend beyond 6 inches from the trailer walls.

However, such mobile MRI units discontinue superconducting magnet operation during the periods of transporting the MRI unit from one site to the next even though the next site may be at the next town or relatively close to the previous site. This leads to considerable additional expense, time (including equipment down time) in discontinuing the superconducting magnet operation at one site, and in ramping up or reestablishing such operation at the next site. As a result, there has been a long felt need for a practical, yet lightweight, economical method of effectively shielding high field mobile MRI units to enable their transportation between sites while at field or in superconducting operation.

OBJECTS AND SUMMARY OF INVENTION

In accordance with one form of the invention, a mobile magnetic resonance imaging unit includes a passive shielding system utilizing a plurality of ferromagnetic bands surrounding and in contact with the MRI vessel, with the bands being positioned proximate to areas of maximum magnetic field strength in the absence of such bands. The bands cover a minor portion of the axial length of the MRI magnet and are symmetrically placed about a plane which is perpendicular to the axis at the center of the MRI. In one embodiment, there are three bands with the band in the center extending axially a distance greater than the other two bands, and with the other bands positioned in the area of maximum field strength contiguous to the bucking coil. The intermediate band extends approximately 17"in the axial direction, the remote bands extend approximately 8", and the bands are approximately 1.25"thick.

It is an object of the present invention to provide an improved mobile superconducting MRI magnet assembly including a passive shielding system in which the stray magnetic field is adequately confined to enable transporting the magnet at field.

It is another object of the present invention to provide a mobile MRI superconducting magnet transportable at field which minimizes the weight of the shielding material.

It is another object of the present invention to provide an improved mobile superconducing MRI magnet assembly including a passive shielding system in which magnet homogeneity constraints can be met in an uncomplex manner.

It is a further object of the present invention to provide a mobile MRI superconducting magnet with improved shielding which is uncomplex and which may be retrofitted onto existing superconducting magnets.

BRIEF DESCRIPTION OF DRAWINGS

FIG. 1 is a drawing of an MRI magnet incorporating the present invention.

FIG. 2 is a cross section of FIG. 1 showing details of the magnet coils within the MRI magnet, and also including the lead connector assembly.

FIG. 3 is a plot of the magnetic field outside a prior art trailer mounted mobile MRI superconducting magnet.

FIG. 4 is a plot of the magnetic fields surrounding a mobile MRI superconducting magnet incorporating the subject invention showing the change in the spatial confinement of the surrounding magnetic field within acceptable limits.

DETAILED DESCRIPTION OF PREFERRED EMBODIMENT OF INVENTION

Referring first to FIGS. 1 and 2, MRI superconducting magnet assembly 2 includes outer shell or vacuum vessel 3 having a somewhat donut shape and forming central axially extending imaging bore 6. Pressurized vessel 4 concentrically positioned within vacuum vessel 2 includes a main magnet coil 15 consisting of a plurality of separated magnet coils 16, 17, 18, 19, 20 and 21 wound in grooves in composite drum or support 7. Also positioned within pressurized vessel 4 are bucking coils 23 and 24 which surround portions of main magnet coil 15 to reduce the stray magnetic field while providing a strong homogeneous magnetic field in central imaging bore 6, particularly in the central region surrounding plane 25 perpendicular to axis 5. A plurality of heat shields 9 and 10 may be positioned around pressurized vessel 4 to maintain temperatures intermediate the superconducting temperature within a pressurized vessel and the temperature on the outside 31 of vacuum vessel 3. Lead connector assembly 26 shown in simplified form in FIG. 2 provides electrical connection from outside 31 to the coils in pressurized vessel 4 by suitable electrical connectors and leads (not shown) which pass through access opening 28 (see FIG. 1).

Lifting brackets 29 welded to vacuum vessel 3 facilitate lifting and installation of MRI superconducting magnet assembly 2 while 2 pairs of mounts or feet 30 facilitate the support and securing of the MRI superconducting magnet in a mobile van or trailer (shown schematically in FIGS. 3 and 4).

As is well known in the art, when the temperature within pressurized vessel 4 is reduced to superconducting temperature and current is connected to flow through main magnet coil 15 superconducting magnet 2 may be ramped up to superconducting operation. The superconducting operation can be maintained to generate a strong magnetic field within imaging bore 6 as long as the superconducting temperature is maintained within pressurized vessel 4.

Central passive shielding band 33 is welded around vacuum vessel 3 in the central region about central plane 25, and includes an access opening 28 through central band 33 and vacuum vessel 3 for lead assembly 26. Central shielding band 33 is 17"long and 1.25"thick and surrounds vacuum vessel 3 proximate to central main magnet coils 18 and 19. Shielding bands 34 and 35 are positioned axially to be located at the regions of maximum or high magnetization in vacuum vessel 3 generated by MRI magnet coils 15 in the absence of the shielding bands to provide the most effective shielding. MRI magnet 2 is symmetrical about central plane 25 with remote shielding bands 34 and 35 parallel, perpendicular to bore 5 and equally spaced from the central plane. Remote shielding bands 34 and 35 are also approximately axially positioned to surround bucking coils 23 and 24, respectively.

In one embodiment of the present invention, the axial length of vacuum vessel 3 is 87¾", the centers of shielding bands 34 and 35 are 23½" from plane 25 and central shielding band 23 is positioned equally on both sides of plane 25. Main magnet coils 17–21 extend axially a distance of 30.7"along composite drum 7 on either side of plane 25 with the centers of magnet coils 18 and 19 being 3.9"from plane 9, and the centers of magnet coils 17 and 20 being 13.0"from plane 25, and with the centers of magnet coils 16 and 21 being 27.0"from plane 25. Magnet coils 18 and 19 extend 3.7"in the axial direction, magnet coils 17 and 20 extend 5.0"in the axial direction, and magnet coils 16 and 21 extend 7.2"in the axial direction. The center of bucking coils 23 and 24 are 23.5"from plane 25 and the bucking coils extend 7.3"in the axial direction.

Remote passive shielding bands 34 and 35 are each 8" long and 1.25"thick, are spaced from, and parallel to, central shielding band 33, being welded to the outside of vacuum vessel 3 contiguous to bucking coils 23 and 24, such that the remote shielding bands are axially spaced from plane 25 approximately the same distance as the bucking coils.

Referring next to FIGS. 3 and 4. FIGS. 3 and 4 are one quarter model plots showing Z-axis 44, radial axis 45 and the magnetic field strength in isogauss outside wall 40 of a mobile towed trailer 41 in which MRI superconducting magnet assembly 2 is positioned. The walls 40 of trailer 41 incorporate shielding which is inadequate for transport of MRI superconducting magnet 2 at field as discussed below. MRI superconducting magnet 2 is at one end of trailer 41, typically the rear, enabling the remainder of the trailer (not shown) to be used for additional MRI equipment, an operator area and a patient reception area. FIGS. 3 and 4 show only a portion of trailer 41 and MRI superconducting magnet 2, and essentially show one half of the magnetic field generated by MRI superconducting magnet 2 contiguous to half of the main magnet coils, namely coils 19, 20 and 21. The positioning of main magnet coils 18, 17 and 16 below radial axis 45, of FIGS. 3 and 4 would provide a mirror image of the figures about axis 45 but are not shown in the interest of simplicity. Similarly, the mirror image about axis 44 is not shown. Thus the plot of FIGS. 3 and 4 show approximately one fourth of the total substantially symmetrical magnetic field pattern.

It is to be noted that the required 5 gauss magnetic field strength containment limit 42 is 6 inches outside the wall or side 40 of trailer 41, with the distance in meters being shown along the axes in what are essentially top views of a quarter section of MRI magnet 2 in trailer 41. The resultant isogauss field plots of MRI superconducting magnet 2 at field is represented by the curved plots such as 5 gauss line 50. It is to be noted that in FIG. 3 the five gauss line 50 extends a considerable distance outside containment limit 42, as does ten gauss line 48. The magnetic field 37 decreases as the distance from MRI superconducting magnet 2 increases. Thus, FIG. 3 shows that an extremely strong magnetic field would extend way beyond the desired containment limit 42 without the magnetic shielding of the present invention.

Remote shielding bands 34 and 35 are placed around vacuum vessel 3 at the regions of maximum or high magnetization, in this case the Z component of magnetization directed axially along the vacuum vessel of FIG. 3. As shown in FIG. 3, the high magnetization normally occurs in the region of bucking coils 23 and 24. If more than two axially spaced bucking coils 23 and 24 are provided there may be additional regions of high Z component magnetization which may be radially contained by additional remote shielding bands such as 34 and 35. A plot of such magnetization axially along the central region of vacuum vessel 3, which may be done by computer analysis, shows that such maximum or high magnetization peaks may be somewhat flattened indicating locations for remote shielding bands such as 34 and 35 which are positioned such that their axial direction centers are approximately in the central regions of such magnetization peaks. It is possible than all of such peaks may not be of the same magnitude. Shielding bands may be positioned on vacuum vessel 3 around such additional peaks as is required for the desired confinement of magnetic field 38.

In the operation of mobile MRI superconducting magnet 2 of FIG. 3 such as at a site such as a hospital parking lot, barricades and barriers could be placed around walls 40 of trailer 41 at a distance greater than the five gauss line 50 of magnetic field pattern 37 to preclude any person or equipment coming within the barricaded area encircling the magnetic field strengths of greater than 5 gauss. However, if MRI superconducting magnet 2 of FIG. 3 were maintained at field during transportation of trailer 41, persons in passing automobiles and in regions of temporary stops of trailer 41 such as truck weighing stations, rest stops, refueling stops and other places would be subjected to magnetic fields far in excess of the 5 gauss limit of the regulations as would any other electronic equipment in the surrounding area such as at weighing stations or in passing police cars and other vehicles. As a result, the MRI installation of FIG. 3 in trailer 41 could not be transported at field.

FIG. 4 shows that the passive shielding of the present invention including shielding bands 33 and 35 results in a greatly improved confined magnetic field pattern 38. As shown in FIG. 4, 3 gauss line 54, four gauss line 52 and 5 gauss line 154 are contained well within the required containment limit 42 for transportation of MRI magnet 2 at field, with five gauss line 154 extending only some 4 inches beyond wall 40 of trailer 41 at its greatest distance. Four gauss line 52 is very close to, or even within the confines of walls 40 of trailer 41.

Thus, the mobile installation of MRI superconducting magnet 2 in trailer 41 incorporating the present invention as shown in FIG. 4 can be legally and properly transported at field between consecutive sites at which the mobile MRI installation is utilized for the imaging of patients without exceeding magnetic field strength confinement or containment limits. The passive shielding including bands 33, 34 and 35 are not only uncomplex and inexpensive, they are also relatively lightweight enabling the weight of trailer 41 to be readily maintained within the weight limits mandated by the Department of Transportation for federal highways and/or bridges and as may be mandated for state highways.

The uncomplex passive shielding bands of the present invention may be readily retrofitted on to outside of existing MRI superconducting magnets without the significant expense of cutting open pressurized vessel 4 or vacuum vessel 2 to enable transportation at field of the retrofitted superconducting magnets if field homogeneity constraints can be met or maintained. The present invention could also be utilized for MRI magnets used in low cost fixed site MRI imaging rooms such as those in hospitals to minimize the amount, weight and cost of conventional wall or other shielding of the imaging room to provide the required spatial confinement of the strong magnetic fields generated by MRI magnet.

Shielding bands 33, 34 and 35 could be axially adjustable on vacuum vessel 3 to enable fine tuning or adjustment at a particular site, although welding remote bands 34 and 35 on the vacuum vessel at the approximate or precise regions of maximum magnetic field strength of MRI magnet assembly 2 is a simple way to resist the strong magnetic field forces exerted on the bands.

While the present invention has been described with respect to certain preferred embodiments thereof, it is to be understood that numerous variations in details in construction, the arrangement and combination of parts, and the type of materials used may be made without departing from the spirit and scope of the invention.

What we claim is:

1. A passive magnetic field shielding system for a magnetic resonance imaging magnet including an outer vessel and superconducting magnet coils within an inner vessel and capable of transportation while in superconducting operation comprising:

a plurality of arcuate ferromagnetic shielding bands surrounding and spaced along the axis of said magnetic resonance imaging magnet;

at least some of said arcuate bands being secured about said outer vessel proximate to areas of maximum magnetization of said outer vessel in the absence of said bands; and said ferromagnetic shielding bands covering a minor portion of the axial length of said magnetic resonance imaging magnet.

2. The passive magnetic field shielding apparatus of claim 1 wherein there are at least three of said arcuate ferromagnetic shielding bands, a central band and two axially separated remote bands.

3. The passive magnetic field shielding apparatus of claim 2 wherein there are three bands, and the central band is positioned axially about a said plane perpendicular to said axis at the central region thereof and extends axially a distance greater than said two remote bands.

4. The passive magnetic field shielding apparatic of claim 3 wherein said outer vessel is an evacuated vessel surrounding a superconducting main magnet coil assembly including at least one main magnet coil positioned on a support, and wherein said shielding bands surround said evacuated vessel.

5. The passive magnetic field shielding apparatus of claim 4 wherein said shielding bands are welded to said evacuated vessel.

6. The passive magnetic field shielding apparatus of claim 4 wherein said at least one main magnet coil includes a plurality of main magnet coils axially separated along said support.

7. The passive magnetic field shielding apparatus of claim 2 wherein at least one bucking coil concentrically surrounds said support, and is radially spaced from said at least one main magnet coil.

8. The passive magnetic field shielding apparatus of claim 7 wherein at least one of said remote shielding bands are positioned approximately contiguous to, but radially spaced from, at least one said bucking coil.

9. The passive magnetic field shielding apparatus of claim 8 wherein a remote shielding band is contiguous to each of said bucking coils.

10. The passive magnetic field shielding apparatus of claim 9 wherein each of said remote bands extend in the axial direction a distance approximately one half that of the central band.

11. The passive magnetic field shielding apparatus of claim 10 wherein said central band extends approximately 17 inches in the axial direction.

12. The passive magnetic field shielding apparatus of claim 11 wherein said shielding bands are approximately 1.25 inches thick in the radial direction.

13. The passive magnetic field shielding apparatus of claim 8 wherein said main magnet coils extend in an axial direction beyond said bucking coils.

14. The passive magnetic field shielding apparatus of claim 13 wherein said bucking coils are positioned axially approximately 9/10 of the axial distance said main magnet coils extend.

15. The passive magnetic field shielding apparatus of claim 3 wherein said remote bands are positioned approximately ½ of the distance from said plane to the ends of said outer vessel remote from said plane.

16. The passive magnetic field shielding apparatus of claim 2 wherein said magnetic resonance imaging magnet is mounted in a moveable enclosure and said bands are dimensioned to confine said magnetic field to a field strength of less than 5 gauss 6 inches or less from the walls of said enclosure and said magnetic resonance imaging magnet may be transported at field without exceeding governmental regulations on field strength containment.

17. The passive magnetic field shielding apparatus of claim 16 wherein said walls of said enclosure include shielding material and the additional weight of said bands is sufficiently small to enable the transportation of said magnetic resonance imaging magnet without exceeding governmental regulations limiting the weight of vehicles on federal highways.

18. The passive magnetic field shielding of claim 3 wherein said remote bands are adjustable affixed to said magnetic resonance imaging magnet enabling adjustment in the axial direction.

* * * * *